United States Patent
Ding et al.

(10) Patent No.: US 9,059,051 B2
(45) Date of Patent: Jun. 16, 2015

(54) INLINE MEASUREMENT OF THROUGH-SILICON VIA DEPTH

(71) Applicant: International Business Machines Corporation, Armonk, NY (US)

(72) Inventors: Hanyi Ding, Colchester, VT (US); J. Edwin Hostetter, Jr., Pleasant Valley, NY (US); Ping-Chuan Wang, Hopewell Junction, NY (US); Kimball M. Watson, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 65 days.

(21) Appl. No.: 13/889,374

(22) Filed: May 8, 2013

(65) Prior Publication Data

US 2014/0332973 A1    Nov. 13, 2014

(51) Int. Cl.
*H01L 21/66* (2006.01)

(52) U.S. Cl.
CPC ............. *H01L 22/14* (2013.01); *H01L 22/34* (2013.01)

(58) Field of Classification Search
None
See application file for complete search history.

(56) References Cited

U.S. PATENT DOCUMENTS

| | | | |
|---|---|---|---|
| 6,720,229 B2 | 4/2004 | Norström et al. | |
| 7,491,555 B2 * | 2/2009 | Lehr et al. | 438/14 |
| 7,904,273 B2 | 3/2011 | Liu et al. | |
| 8,232,115 B2 | 7/2012 | Ding et al. | |
| 2010/0261159 A1 * | 10/2010 | Hess et al. | 435/6 |
| 2011/0168995 A1 | 7/2011 | Doong et al. | |
| 2011/0193199 A1 * | 8/2011 | Filippi et al. | 257/621 |
| 2012/0018723 A1 | 1/2012 | Su et al. | |
| 2012/0097944 A1 | 4/2012 | Lin et al. | |
| 2012/0292763 A1 * | 11/2012 | Filippi et al. | 257/738 |
| 2012/0297608 A1 * | 11/2012 | Miyazaki | 29/592.1 |
| 2013/0002272 A1 | 1/2013 | Badaroglu et al. | |
| 2013/0006557 A1 | 1/2013 | Chakrabarty et al. | |
| 2013/0069062 A1 * | 3/2013 | Bhoovaraghan et al. | 257/48 |

* cited by examiner

*Primary Examiner* — Thao P Le
(74) *Attorney, Agent, or Firm* — Howard H. Cohn; William H. Steinberg

(57) ABSTRACT

A through-silicon via (TSV) capacitive test structure and method of determining TSV depth based on capacitance is disclosed. The TSV capacitive test structure is formed from a plurality of TSV bars that are evenly spaced. A first group of bars are electrically connected to form a first capacitor node, and a second group of bars is electrically connected to form a second capacitor node. The capacitance is measured, and a TSV depth is computed, prior to backside thinning. The computed TSV depth may then be fed to downstream grinding and/or polishing tools to control the backside thinning process such that the semiconductor wafer is thinned such that the backside is flush with the TSV.

11 Claims, 5 Drawing Sheets

INLINE MEASUREMENT OF THROUGH-SILICON VIA DEPTH

FIELD OF THE INVENTION

The present invention relates generally to semiconductor fabrication, and more particularly, to inline measurement of through-silicon via depth.

BACKGROUND OF THE INVENTION

A through-silicon-via, or TSV, provides electrical continuity between the top and bottom surfaces of a semiconductor chip. A TSV is fabricated by deep etching into the silicon wafer, or substrate that comprises the semiconductor chip, and filling the resulting hole with a liner and a metal filling. The silicon substrate is then ground, or thinned, from the backside until the metal filling is exposed, and backside metal (BSM) is disposed on the thinned backside surface for electrical contact. If the silicon is not etched deeply enough, the TSV may be defective. However, the TSV is not electrically functional before silicon thinning and BSM deposition are completed, therefore, conventional inline electrical testing cannot be used to determine whether the TSV is defective until these steps are completed. It is therefore desirable to have an improved inline measurement of through-silicon via depth.

SUMMARY OF THE INVENTION

In a first aspect, the present invention provides a method for determining depth of a through-silicon via, comprising: measuring a capacitance of a through-silicon via (TSV) capacitive test structure on a semiconductor wafer; and calculating a through-silicon via depth based on the capacitance.

In a second aspect, the present invention provides a method for determining depth of a through-silicon via, comprising: measuring a first capacitance of a first through-silicon via (TSV) capacitive test structure having a first depth; measuring a second capacitance of a second TSV capacitive test structure having a second depth; and defining a curve comprising a first data point representative of the first capacitance and a second data point representative of the second capacitance.

In a third aspect, the present invention provides a structure for determining depth of a through-silicon via, comprising: a plurality of through-silicon via (TSV) bars formed in a semiconductor wafer, wherein the plurality of TSV bars are formed with a uniform length and interspacing; a first set of metallization lines connecting a first group of the plurality of TSV bars; and a second set of metallization lines connecting a second group of the plurality of TSV bars.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
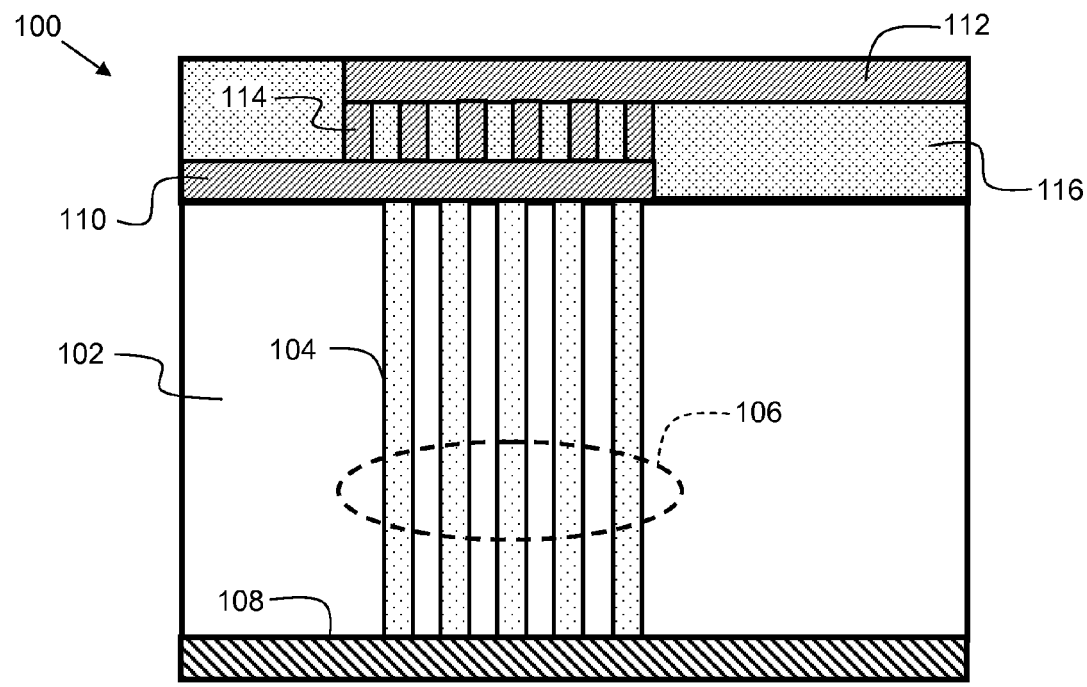

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

Figure 2:
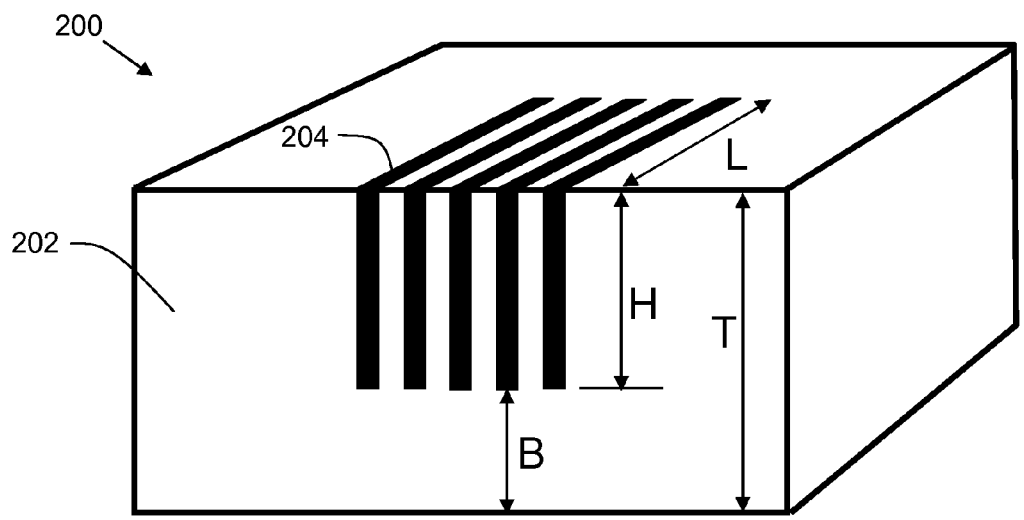
Figure 3:
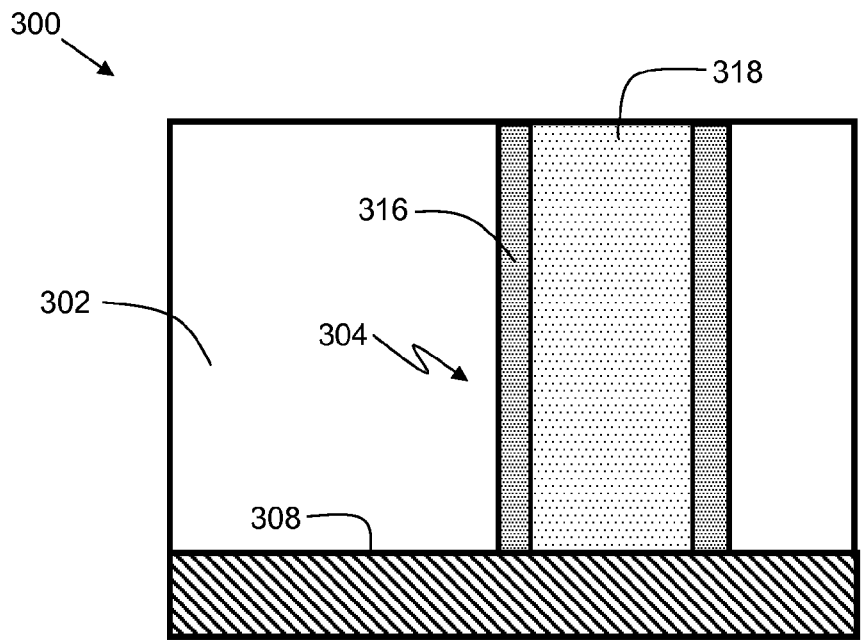
Figure 4:
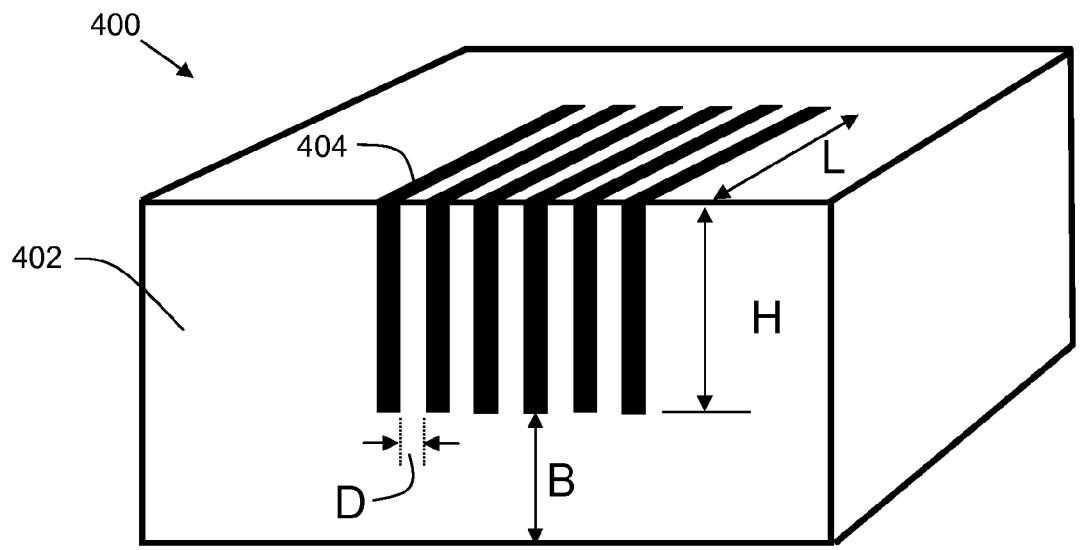
Figure 5:
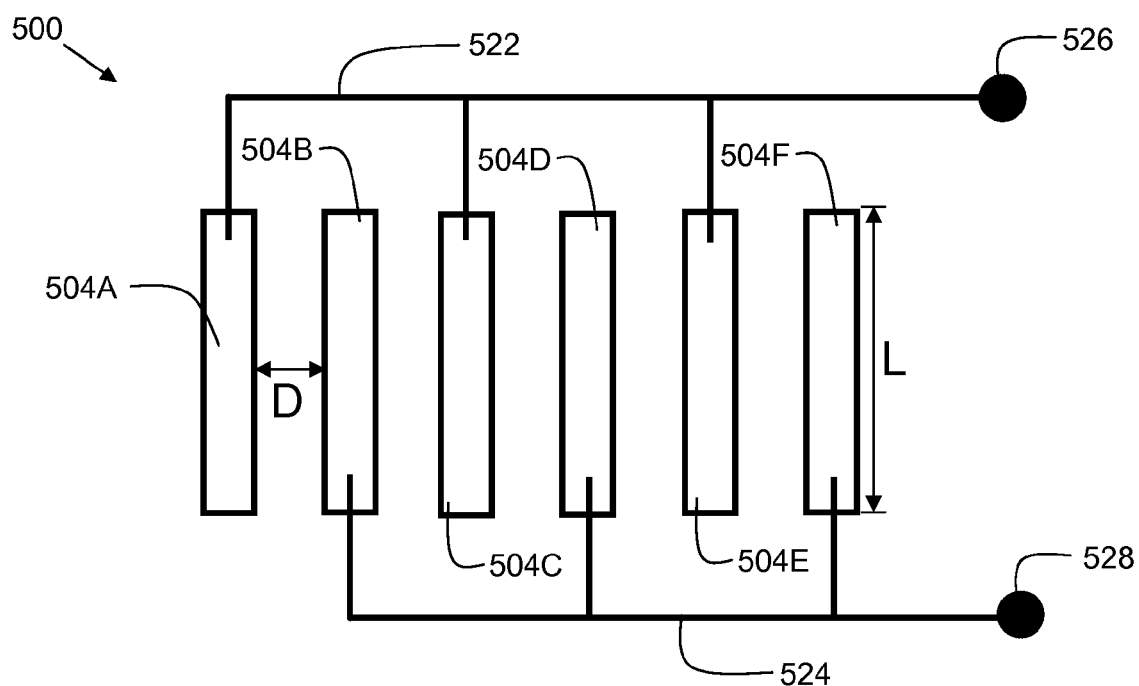
Figure 6:
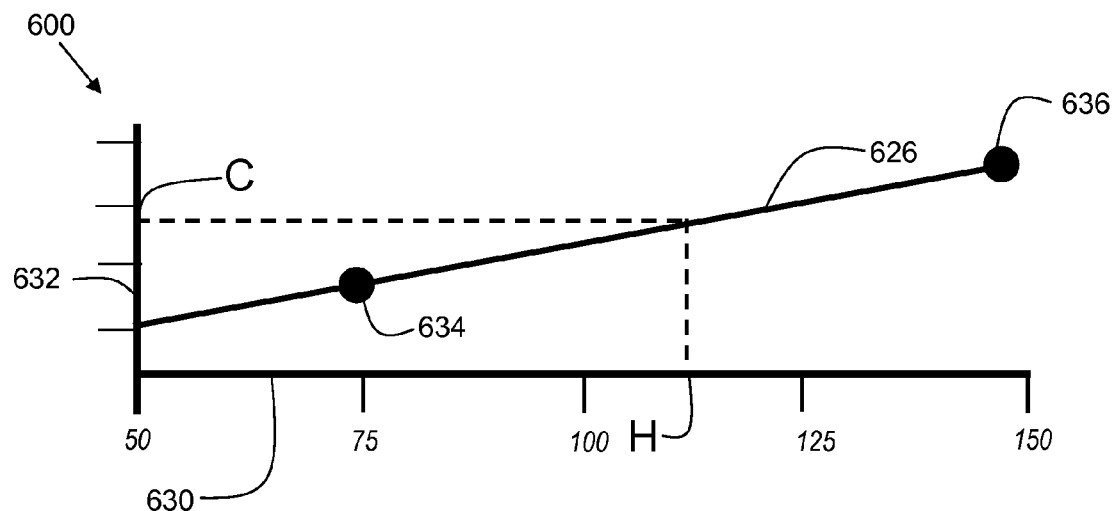
Figure 7:
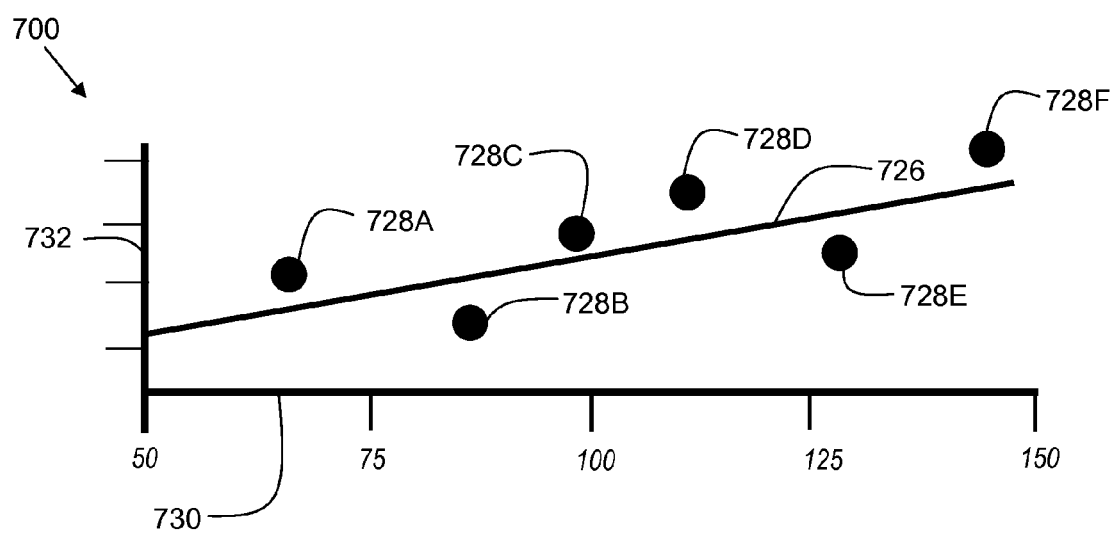
Figure 8:
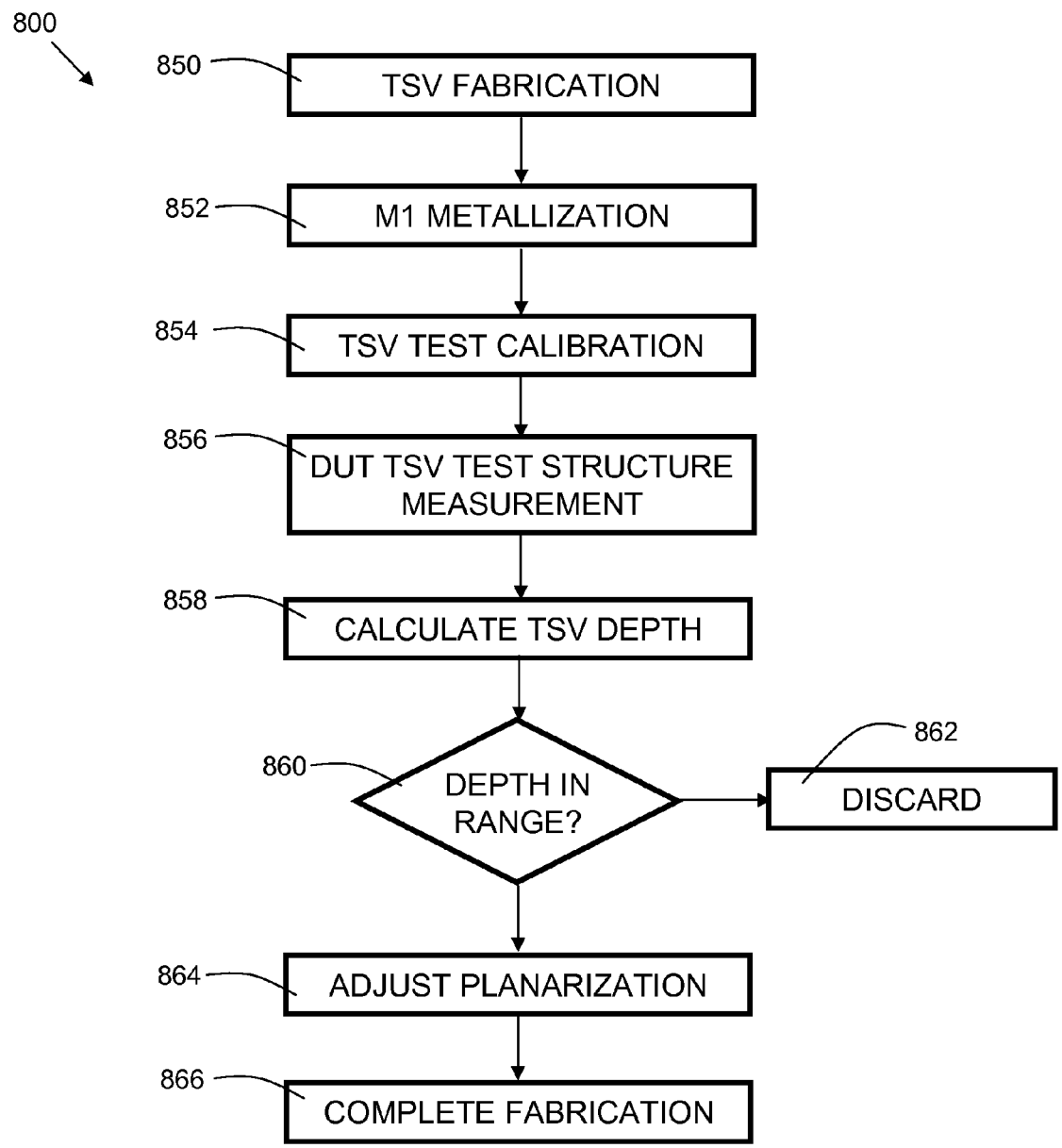

FIG. 1 is a side cutaway view of a group of TSV bars.
FIG. 2 is a perspective view of a group of TSV bars.
FIG. 3 is a side view showing details of a TSV bar.
FIG. 4 is a perspective view of a TSV capacitive test structure.
FIG. 5 is a top-down view of a TSV capacitive test structure.
FIG. 6 is a graph indicating a relationship between capacitance and TSV depth.
FIG. 7 is a graph with a best fit line indicating a relationship between capacitance and TSV depth.
FIG. 8 is a flowchart indicating process steps for embodiments of the present invention.

DETAILED DESCRIPTION

FIG. 1 is a side cutaway view of a group of TSV bars within a semiconductor structure 100, which comprises a semiconductor substrate 102. Substrate 102 may be a silicon wafer. A group of through-silicon via (TSV) bars is indicated generally as 104. A TSV 106 may be comprised of multiple TSV bars 104. Each TSV bar extends through the substrate 102, and contacts a backside metal 108 at one end, and a first level metallization layer 110 at the other end. In embodiments, the backside metal 108 is mainly comprised of copper. The first level metallization layer 110 may also be referred to as an "M1 layer." An interlayer dielectric 116 may be disposed on substrate 102. An additional metallization layer 112 may be formed within the interlayer dielectric 116, and may be connected to the metallization layer 110 with a via layer 114. The second level metallization layer 112 may also be referred to as an "M2 layer." More metallization layers beyond metallization layer 112 are possible. Metallization layer 110, 112, and any other subsequent metallization layers present comprise a so-called back end of line (BEOL) stack. The TSV 106 is able to direct high currents from the metallization layer 110 to the backside metal 108. In some cases, backside metal 108 may be a ground plane.

FIG. 2 is a perspective view of a semiconductor structure 200 comprising of a group of TSV bars, indicated generally as 204. Each TSV bar 204 is formed by etching a cavity of length L to a depth H in semiconductor substrate 202. Depth H is less than the full thickness T of the semiconductor substrate 202, such that a backside thickness B remains unetched. Once the TSV cavities are formed and filled, the backside thickness B is removed via a planarization process to expose each TSV bar 204. The planarization process may comprise grinding and polishing. The planarization process may include a chemical mechanical polish (CMP) process. Until the planarization process is complete, and the backside metal (108 of FIG. 1) is formed, the TSV bars 204 are not electrically active, and hence it is not possible to verify the depth of the TSV bars by electrical conduction before these steps are complete. Embodiments of the present invention provide a method and test structure for determining the TSV bar depth prior to the planarization and backside metal formation steps, which can serve to improve product yield.

FIG. 3 is a side view of a semiconductor structure 300 showing details of a TSV bar 304. The TSV bar 304 extends through the substrate 302, and contacts backside metal 308. The TSV bar 304 may have a diffusion barrier layer 316 formed in an outer portion of the TSV cavity. In some embodiments, the diffusion barrier layer 316 may comprise tantalum nitride (TaN) and/or titanium nitride (TiN). A conductive fill material 318 is disposed in an inner portion of the TSV cavity. In some embodiments, the conductive fill material 318 is comprised of copper. In other embodiments, the conductive fill material 318 is comprised of tungsten.

FIG. 4 is a perspective view of a semiconductor structure 400 indicating a plurality of TSV bars 404 for implementation of a through-silicon via capacitive test structure. A through-silicon via capacitive test structure in accordance with embodiments of the present invention has a number of TSV bars 404. In some embodiments, the number of TSV bars comprises between 6 to 12 TSV bars. In other embodiments, the number of TSV bars comprises between 2 to 4 TSV bars. Some embodiments may have an even number of bars, while other embodiments may have an odd number of bars. Generally, the accuracy of a through-silicon via capacitive test structure is improved when more bars are used. Each TSV bar is spaced from its nearest neighboring TSV bar by uniform interspacing distance D. In some embodiments, the interspacing distance D ranges from about 3 micrometers to about 5 micrometers. In some embodiments, each of the TSV bars has a uniform length L ranging from about 10 micrometers to about 100 micrometers. In embodiments, the depth H may range from about 50 micrometers to about 200 micrometers.

FIG. 5 is a top-down view of a TSV capacitive test structure 500. A plurality of TSV bars 504A-504F forms a capacitor. The plurality of TSV bars comprises a first group of bars belonging to one node of the capacitor, and a second group of bars belonging to another node of the capacitor. In the example of FIG. 5, there are six TSV bars 504A-504F, where three of the TSV bars (504A, 504C, and 504E) are connected to test point 526 via metallization layer line 522, and where the other three TSV bars (504B, 504D, and 504F) are connected to test point 528 via metallization layer line 524. Metallization layer lines 522 and 524 may be comprised of copper or aluminum. A capacitance value C can be measured between test point 526 and test point 528. The capacitance value C is related to the TSV depth as follows:

$$C \sim (N-1) \times A/D$$

Where N is the number of TSV bars in the TSV capacitive test structure;
A is the area of the TSV bar; and
D is the interspacing between each TSV bar.

The area A of the TSV bar is L×H, and thus, the capacitance C can be described by:

$$C \sim (N-1) \times (L \times H)/D$$

The values for N, L, and D are known. By measuring capacitance for TSV capacitive test structures with different TSV bar depths, a mathematical relationship is derived that describes TSV depth as a function of capacitance. This capacitance can be measured prior to the backside thinning process and backside metallization process. Hence, the depth of a TSV can be ascertained prior to those steps. This can improve yield as wafers having a TSV depth outside of a predetermined range can be discarded without doing any of the backside thinning processing, thus saving cost. Additionally, the TSV depth information obtained from measuring the capacitance of a TSV capacitive test structure may be input to a grinding and/or polishing tool to adjust the parameters of the planarization process such that the backside of the substrate is made even with the TSV bars. The TSV capacitive test structure is preferably formed in an unused portion of the wafer or die, such as in a kerf region.

FIG. 6 is a graph 600 indicating a relationship between capacitance and TSV depth. The horizontal (X) axis 630 represents TSV bar depth. The horizontal axis units may be in micrometers. The vertical (Y) axis 632 represents capacitance. The vertical axis units may be in femtofarads (fF). In embodiments, a method for calibration may comprise measuring a first capacitance of a first through-silicon via (TSV) capacitive test structure having a first depth. This is plotted on graph 600 as point 634. Then, the method further comprises measuring a second capacitance of a second TSV capacitive test structure having a second depth. This is plotted on graph 600 as point 636. A curve 626 is then defined comprising first data point 634 representative of the first capacitance and second data point 636 representative of a second capacitance. The curve 626 may be a line connecting the two data points 634 and 636. Various factors may affect the slope of the line, such as the TSV bar taper versus depth, which can affect the relationship between capacitance and TSV depth.

Once the curve is established via an initial calibration process, embodiments of the present invention can then measure the capacitance of a TSV capacitive test structure of a device under test (DUT) to determine if the TSV depth is within range. In some embodiments, multiple ranges may be established. A TSV depth within a first range may indicate a TSV depth is within specification with no downstream adjustment necessary. A TSV depth within a second range may indicate a TSV depth is slightly outside of the desired specification, but is correctable by adjusting downstream grinding and/or polishing parameters. A TSV depth within a third range may indicate a TSV depth is outside of specification and uncorrectable, and thus may be discarded.

FIG. 7 is a graph 700 with a best fit line indicating a relationship between capacitance and TSV depth. The horizontal (X) axis 730 represents TSV bar depth. The horizontal axis units may be in micrometers. The vertical (Y) axis 732 represents capacitance. The vertical axis units may be in femtofarads (fF). In this embodiment, more than two capacitance measurements are made to establish a range of data points, indicated as 728A-728F. A best fit line 726 is then derived using a linear regression technique.

FIG. 8 is a flowchart 800 indicating process steps for embodiments of the present invention. In process step 850, a through-silicon via (TSV) is fabricated. The TSV comprises a number of evenly spaced TSV bars. In process step 852, an M1 metallization layer is deposited. The M1 metallization layer includes metal lines to connect a first group of the TSV bars to a first test point, and a second group of the TSV bars to a second test point. In process step 854, a TSV test calibration is performed. This involves measuring the capacitance of TSV capacitive test structures having different depths, to derive a mathematical curve describing a relationship between capacitance and depth, such as the graphs shown in FIG. 6 and FIG. 7. In process step 856, the capacitance of a TSV capacitive test structure of a device under test (DUT) is measured. In process step 858, the TSV depth of the DUT is calculated from the measured capacitance. In process step 860, a check is made to determine if the depth is within a predetermined range. If the depth is outside of a predetermined range, the DUT is discarded in process step 862. In process step 864, optionally, the depth calculated in process step 858 is input to the grinding and/or polishing tools to adjust the planarization process to perform more (or less) backside thinning as needed as to make the backside planar (flush) with the TSV bars. Parameters that may be adjusted include, but are not limited to, adjustment of chemical mechanical polish (CMP) parameters, such as polishing time, polishing head rotational speed, and polishing head pressure.

In some embodiments, the polishing time may range from 40 seconds to 60 seconds. In some embodiments, the polishing head rotational speed may range from 70 revolutions per minute (rpm) to about 120 rpm. In some embodiments, the polishing head pressure may range from about 0.5 pounds per square inch (psi) to about 4 psi. Other parameters may be adjusted as necessary to achieve the desired amount of backside thinning based on the depth calculated in process step 858. In process step 866, the fabrication is completed, including completion of the BEOL processing (e.g. layers M2, M3, M4, etc . . . ), backside thinning, backside metallization, and packaging. Embodiments of the present invention may be utilized in the fabrications of 2.5D and/or 3D devices.

Embodiments of the present invention provide a through-silicon via (TSV) capacitive test structure and method of determining TSV depth based on capacitance. The TSV capacitive test structure is formed from a plurality of TSV bars that are evenly spaced. A first group of bars are electrically connected to form a first capacitor node, and a second group of bars is electrically connected to form a second capacitor node. The capacitance is measured, and a TSV depth is computed, prior to backside thinning. The computed TSV depth may then be fed to downstream grinding and/or polishing tools to control the backside thinning process such that the semiconductor wafer is thinned such that the backside is flush with the TSV. Therefore, embodiments of the present invention provide early detection of problems with the TSV depth, and also allow for correction of some TSV depth problems, thus saving costs, and improving overall product yield.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A structure for determining depth of a through-silicon via, comprising:
    a plurality of through-silicon via (TSV) bars formed in a semiconductor wafer, wherein the plurality of TSV bars are formed with a uniform length and interspacing;
    a first set of metallization lines connecting a first group of the plurality of TSV bars, wherein the first group of TSV bars forms a first capacitor node of the structure; and
    a second set of metallization lines connecting a second group of the plurality of TSV bars, wherein the second group of TSV bars forms a second capacitor node of the structure; and
    wherein the first group of TSV bars is interleaved with the second group of TSV bars, such that there is an interspacing between each TSV bar, and wherein each TSV bar has at least one neighboring TSV bar from another group.

2. The structure of claim 1, wherein the plurality of TSV bars comprises between 6 to 12 TSV bars.

3. The structure of claim 1, wherein each TSV bar of the plurality of TSV bars comprises:
    a cavity formed in a semiconductor substrate;
        a barrier layer disposed on an outer portion of each cavity; and
        a conductive material filling an inner portion of each cavity.

4. The structure of claim 3, wherein the barrier layer is comprised of tantalum nitride.

5. The structure of claim 3, wherein the barrier layer is comprised of titanium nitride.

6. The structure of claim 3, wherein the conductive material is comprised of tungsten.

7. The structure of claim 3, wherein the conductive material is comprised of copper.

8. The structure of claim 1, wherein the plurality of TSV bars comprises an interspacing ranging from about 3 micrometers to about 5 micrometers.

9. The structure of claim 1, wherein each of the plurality of TSV bars comprises a length ranging from about 10 micrometers to about 100 micrometers.

10. The structure of claim 1, wherein the first set of metallization lines and the second set of metallization lines comprise M1 metallization lines.

11. The structure of claim 10, wherein the first set of metallization lines and the second set of metallization lines are comprised of a material selected from the group consisting of copper and aluminum.

\* \* \* \* \*